United States Patent
Holzapfel et al.

(10) Patent No.: US 7,019,842 B2
(45) Date of Patent: Mar. 28, 2006

(54) POSITION MEASURING DEVICE

(75) Inventors: Wolfgang Holzapfel, Obing (DE); Andreas Schreiber, Birstein (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 329 days.

(21) Appl. No.: 10/380,847

(22) PCT Filed: Sep. 8, 2001

(86) PCT No.: PCT/EP01/10373

§ 371 (c)(1),
(2), (4) Date: Sep. 24, 2003

(87) PCT Pub. No.: WO02/23131

PCT Pub. Date: Mar. 21, 2002

(65) Prior Publication Data

US 2004/0051881 A1    Mar. 18, 2004

(30) Foreign Application Priority Data

Sep. 14, 2000  (DE) .............................. 100 45 846

(51) Int. Cl.
   *G01B 9/02*    (2006.01)
   *G01B 11/14*   (2006.01)

(52) U.S. Cl. .................. 356/499; 356/494; 356/616; 250/237 G

(58) Field of Classification Search .............. 356/488, 356/494, 499, 521, 616–622; 250/237 G
See application file for complete search history.

(56) References Cited

U.S. PATENT DOCUMENTS

| | | | |
|---|---|---|---|
| 5,079,418 A * | 1/1992 | Michel et al. | 250/237 G |
| 5,120,132 A * | 6/1992 | Spies et al. | 250/237 G |
| 5,206,704 A * | 4/1993 | Huber et al. | 250/237 G |
| 5,333,048 A * | 7/1994 | Michel et al. | 250/237 G |
| 6,771,377 B1* | 8/2004 | Jones et al. | 250/237 G |
| 2004/0090636 A1* | 5/2004 | Holzapfel et al. | 356/499 |

FOREIGN PATENT DOCUMENTS

| | | |
|---|---|---|
| EP | 0 481 356 A2 | 4/1992 |
| EP | 0 387 520 B1 | 5/1993 |
| EP | 0 611 952 A1 | 8/1994 |
| EP | 0 611 952 B1 | 4/1997 |
| JP | 2 479 445 | 10/1981 |

OTHER PUBLICATIONS

Yim-Bun Patrick Kwan et al., "Massarbeit Nanometer-genauePositionmessung in allen Frieheitsgraden", F&M, Jahrg. 108, No. 9, 2000, pp. 60-64.

* cited by examiner

*Primary Examiner*—Gregory J. Toatley, Jr.
*Assistant Examiner*—Patrick Conolly
(74) *Attorney, Agent, or Firm*—Brinks Hofer Gilson & Lione

(57) ABSTRACT

A position measuring device for detecting the relative position of a scanning unit and a scale. The position measuring device includes a scale and a scanning unit that is displaced with respect to the scale in a measuring direction. The scanning unit includes a scanning grating, a ridge prism and an optoelectronic detector element. The ridge prism having a ridge that is oriented parallel with the measuring direction, the ridge prism acts as a retro-reflector in a second direction which is aligned in a plane of the scale vertically with respect to the measuring direction.

18 Claims, 7 Drawing Sheets

POSITION MEASURING DEVICE

BACKGROUND OF THE INVENTION

1. Field of the Invention

The present invention relates to a position measuring device.

2. Description of the Related Art

In the course of chip production by wafer steppers it is necessary to position the mask and the substrate extremely accurately. For this purpose it is known to detect positional changes of the mask table by laser interferometers. In this connection the effects of disturbances in the air are detrimental, which in the end lead to positional noise and problems in regard to reproducibility. In order to keep the effects of heat expansion low, the measurement of the position of the substrate table or the mask table directly and relative to the optical imaging system would be advantageous. However, often the mounting of laser interferometers directly on the optical imaging system of the wafer stepper is not possible and not desired for reasons of space limitation and because of the thermal dissipation, so that it is necessary to fasten all parts of the laser interferometer on a special frame made of Invar or Zerodur. The changing of the lasers and the recalibration of the laser interferometer also cause considerable problems. The high cost of the six to ten required interferometer shafts are a further disadvantage.

Position measuring devices in the form of grating measuring systems, which scan a grating scale by an optical measuring principle and provide greater reproduction capabilities are conceivable in place of the elaborate and expensive interferometer techniques for detecting positional changes in the x- and y-directions. For example, such a system is described in the publication "Maβarbeit-Nanometergenaue Positionsmessung in allen Freiheitsgraden" (Precision Work-Position Measuring Correct to a Nanometer in all Degrees of Freedom), Y.-B. P. Kwan et al., F & M Vol. 108 (2000) 9, pp. 60 to 64, which includes one or two cross grating graduations and one or several scanning heads, which detect movements in the x- and y-directions. In this case the cross grating graduations have been applied directly to the mask holder.

In order to meet the particularly high demands made on positioning accuracy and reproducibility in connection with such applications, position measuring devices with very short signal periods ($\leq 500$ nm) and many interpolating steps are required. At the same time it is necessary to take into consideration the fact that in the course of aligning the mask with the focal plane of the lens, rotation of the mask holder in all three spatial directions occurs, so that the position measuring device must provide rotatory tolerances between approximately ±3 to ±5 mrad in relation to all three spatial directions. In addition, the position measuring device is required to have a large scanning distance of approximately 5 mm to 20 mm, and to provide a comparatively large distance tolerance of ±1 mm.

A position measuring system of Applicant is known from EP 0 387 520 B1, wherein signal periods of 128 nm result in connection with selected graduation periods, or grating constants of 512 nm. It is possible to achieve positioning accuracies in the sub-nanometer range with this. However, with such small grating constants, twisting of the scale around the direction of the normal line, called Moiré rotation in what follows, leads to opposite directional components along the line direction of the grating graduation of the beams diffracted at the scale. Because of this, the phase surfaces of the interfering signal beams are tilted with respect to each other, which would result in interference strips and a strong signal drop along with it. For solving this problem a triple prism is used as a retro-reflector, which inverts the directional components along the line direction of the grating graduation and in this way images the graduation onto itself. The compensation of the directional components caused by the Moiré rotation will be called Moiré compensation in what follows. A disadvantage of this scanning principle is the beam path, which is inclined in the line direction, i.e. transversely to the measuring direction. The result of this is that distance changes between the scanning unit and the scale cannot be neglected and lead to a change of the indicated position, along with a simultaneous Moiré rotation. Moreover, no large distance tolerances can be achieved by the inclined installation of the scanning unit. A further problem is that the so-called neutral point of rotation does not lie on the scale surface, but in the scanning grating.

By its definition, the neutral point of rotation is understood to be the point around which the scanning unit can be tilted in the measuring direction—this will be called pitch tilt in what follows—without the indicated position being changed in the process. If the neutral point of rotation does not lie on the scale surface, tilting of the scale results in large displacements of the indicated position, which must be eliminated by elaborate correction methods.

Thus, the large prerequisites in positioning the mask table require a position measuring device wherein, on the one hand, the neutral point of rotation is located on the scale graduation, and Moiré rotations are additionally compensated. Moreover, the scale is to be vertically illuminated in order to assure a high degree of symmetry which, for one, permits large distance tolerances, and also avoids other problems in connection with the position determination in case of a distance change and simultaneous Moiré rotation of the scanning unit.

SUMMARY AND OBJECTS OF THE INVENTION

It is therefore an object of the present invention to disclose a high-resolution position measuring device, which is insensitive to tilting, operates dependably in a large distance range and in addition prevents incorrect measurements in case of a Moiré rotation of the scanning head.

This object is attained by a position measuring device for detecting the relative position of a scanning unit and a scale. The position measuring device includes a scale and a scanning unit that is displaced with respect to the scale in a measuring direction. The scanning unit includes a scanning grating, a ridge prism and an optoelectronic detector element. The ridge prism having a ridge that is oriented parallel with the measuring direction, the ridge prism acts as a retro-reflector in a second direction which is aligned in a plane of the scale vertically with respect to the measuring direction.

The steps in accordance with the present invention now assure that the above mentioned problems no longer appear in an appropriately designed position measuring device. In particular, the desired insensitivity to pitch, as well as the desired insensitivity to Moiré rotations, among others, are assured.

The most varied embodiments can be realized on the basis of the considerations in accordance with the present invention.

Further advantages and details of the position measuring device in accordance with the present invention ensue from the following description of several exemplary embodiments by the attached drawings.

Shown are in:

DESCRIPTION OF THE PREFERRED EMBODIMENT(S) OF THE INVENTION

Figure 1:
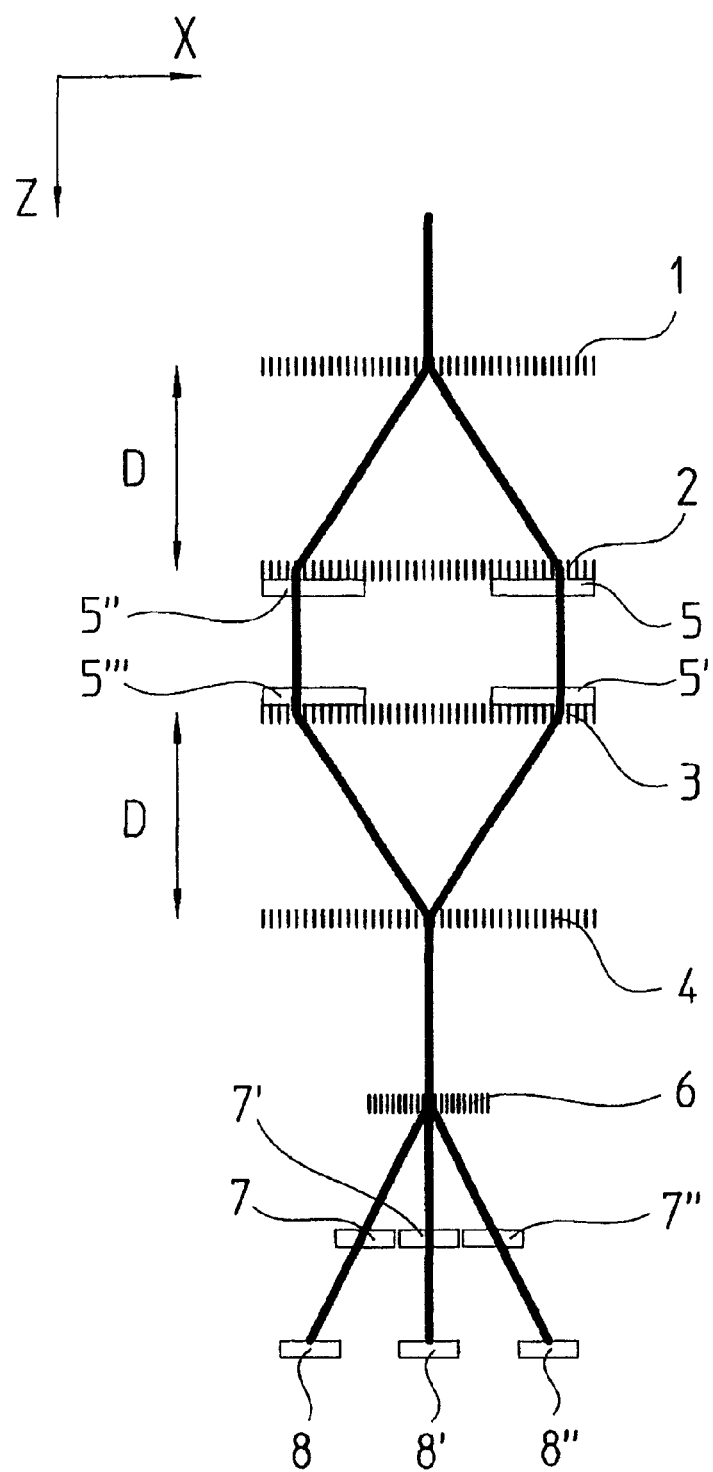
FIG. 1 schematically shows a beam path in a first embodiment of a position measuring device of the present invention in an unfolded representation.

The beam path in a first embodiment of the position measuring device of the present invention is represented in an unfolded representation in FIG. 1. A four-grating transmitter, wherein all gratings, or graduations, have the same grating constant, or graduation period, is used in this example.

The scale grating 1 is vertically illuminated by a collimated laser beam emitted by a light source not represented in FIG. 1. The graduation extends along the x-direction. The light beams emanating by diffraction at the scale grating 1 are propagated to the first scanning grating 2, which is arranged at a distance D from the scale grating. In this case the +/− first orders of diffraction are important. The two light beams are straightened by being diffracted at the first scanning grating 2 and are propagated to the second scanning grating 3. In the course of this, each of the two light beams passes through two polarization-optical retardation elements 5, 5', or 5", 5''', which are embodied as small λ/8 plates and are respectively assigned to a scanning grating 2, 3. Alternatively to this it would also be possible to employ one small λ/4 plate in place of two small λ/8 plates. A left circularly polarized and a right circularly polarized light beam are created by this. At the second scanning grate 3 the light beams are deflected into +/− first orders of diffraction and are propagated to the scale grating 4, where they overlap at one point. The interfering light beams are guided back in the same direction vertically with respect to the scale grating 4 by being diffracted at the scale grating 4. A linearly polarized light beam, whose polarization direction is a function of the scale displacement in the measuring direction (x-direction) is created by the superpositioning of the two circularly polarized light beams, whose phase shift is a function of the scale displacement.

A grating 6 positioned after this splits the light beam into three partial beams, so that by an arrangement of three polarizers 7, 7', 7" of different orientation and associated photoelements 8, 8', 8" it is possible to generate three signals which are phase-shifted by respectively 120°. The signal period corresponds to a quarter of the grating period of the scale grating.

Figure 2A:
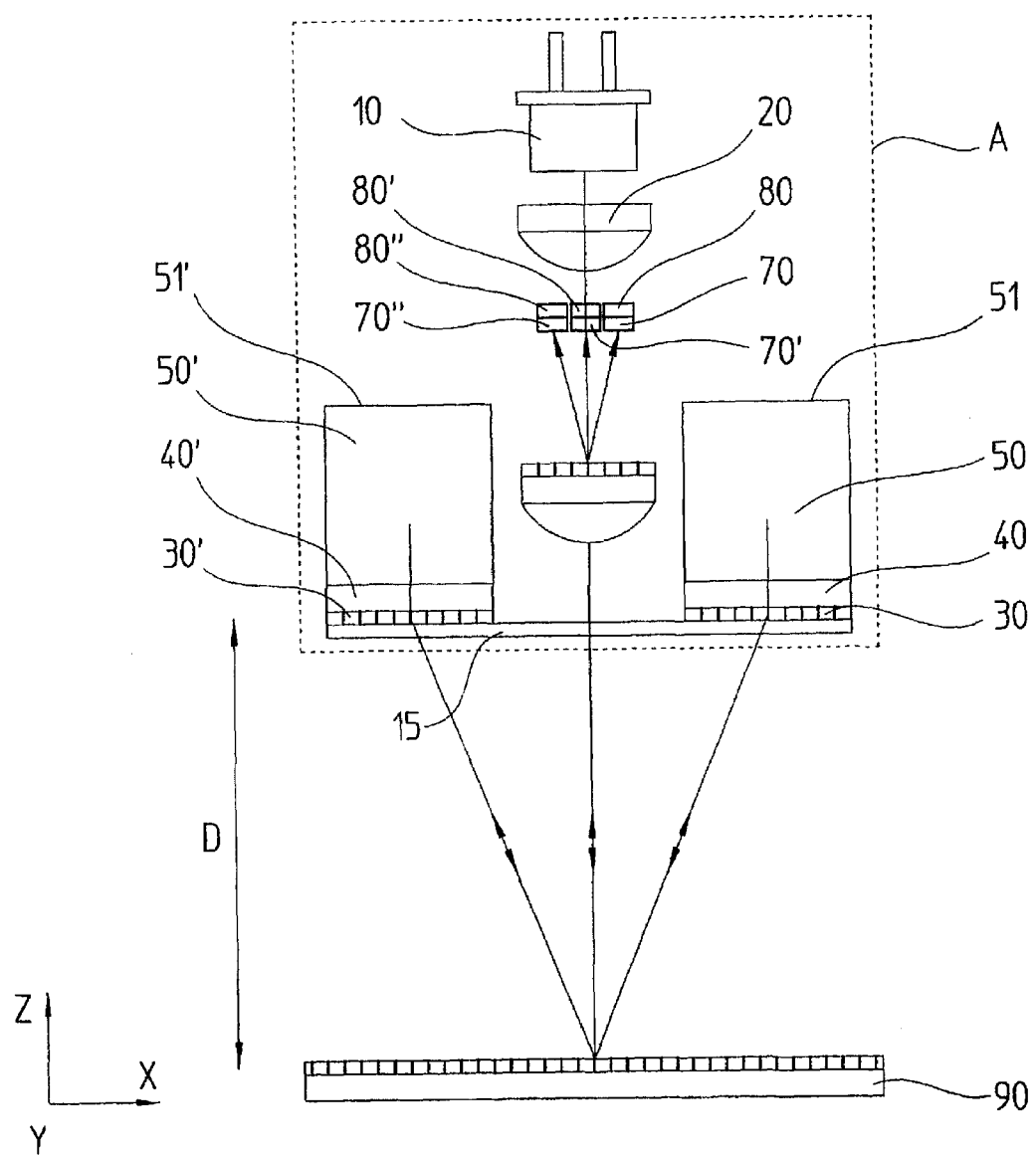
FIGS. 2a, 2b respectively show front and lateral views of the first exemplary embodiment of the position measuring device of the present invention, based on the beam path in accordance with FIG. 1.
Figure 2B:
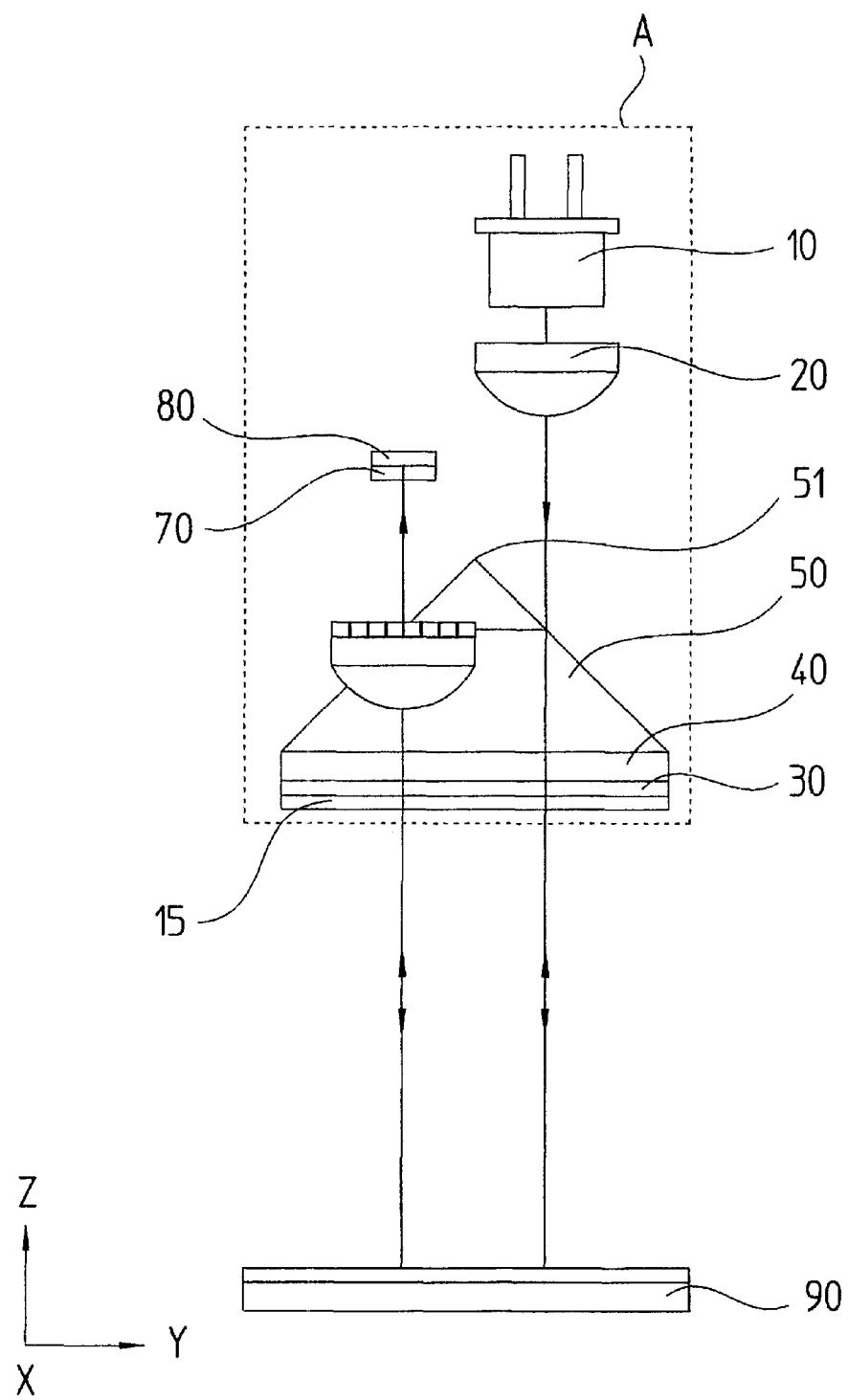

FIGS. 2a and 2b show an actual first exemplary embodiment of the four-grating transmitter, based on the beam path in FIG. 1, in a front and lateral view.

Illumination takes place, for example, by a light source embodied as a laser diode 10 at λ=780 nm, with a following optical collimating device 20. The optical device of the scanning unit A includes the scanning gratings 30, 30', the small λ/8 plates 40, 40', the ridge prisms 50, 50' made of glass, as well as polarizers 70, 70', 70" and photoelements 80, 80', 80''' for producing signals. As shown in FIGS. 2a–b, the prisms 50, 50' include ridges 51, 51', respectively.

The scale 90 or scale body, the latter embodied as a Zerodur mask table, for example, has a reflecting phase graduation with the grating constant d=2 μm. At a distance D=15 mm from the scale graduation there are two ridge prisms 50, 50', each one embodied as a 90° prism, to whose undersides, i.e. on the sides facing the scale 90, scanning gratings 30, 30' in the form of transmission gratings with phase graduation, which have the same grating constant of d=2 μm, are attached. The two ridge prisms 50, 50' and scanning gratings 30, 30' can, for example, be fastened on a common support plate 15. In the present exemplary embodiment the two ridge prisms 50, 50' are arranged spaced apart from each other in the measuring direction.

Alternatively to the explained exemplary embodiment it is also possible to employ a single ridge prism 50, 50' with scanning gratings 30, 30' with bores or cutouts for coupling beams in and out. The combination of the ridge prism 50, 50' and scanning gratings 30, 30' will be called a reversing element in what follows.

If a collimated light beam emitted by the light source 10 impinges vertically and centered between the arrangement of the ridge prisms 50, 50' on the scale 90, two +/− first orders of diffraction are created which, following the first reflection, are guided back to the underside of the ridge prism 50, 50'. Prior to their entry into the ridge prisms 50, 50' and their subsequent passage through it, the light beams are oriented straight in relation to the scale 90 by diffraction at the scanning gratings 30, 30'. The ridge prisms 50, 50' deflect the partial beams in the z- and y-direction and because of this generate a location offset in the y-direction. In the course of the passage of the light beams through the reversing elements, they pass twice through each of the scanning gratings 30, 30', as well as through each of the small λ/8 plates 4, 4'. Based on the orientation, selected in accordance with the present invention, of the at least one ridge prism 50, 50' parallel with the measuring direction x, the ridge prism 50, 50' acts as a retro-reflector in the y-direction. This direction y is oriented in the plane of the scale 90 vertically with respect to the measuring direction x. Following their exit from the ridge prism 50, 50', light beams are generated by repeated diffraction at the scanning grating 30, 30', which are propagated back to the scale 90 and are superimposed on each other there. The interfering light beam is directed back in the z-direction, i.e. in the direction of the detector elements, by the second reflection, or diffraction at the scale 90, and impinges on an arrangement made of a collimator lens and splitting grating 60. Three partial light beams are created at the splitting grating 60. The production of signals from these three light beams takes place in a known manner by the three polarizers 70, 70', 70", through which the partial light beams pass before impinging on the photoelements 80, 80', 80''', where phase-shifted signals then result. Reference is made to EP 481 356 B1 of Applicant in connection with the splitting grating 60.

Moiré rotations of the scale 90 primarily generate an opposite y-deflection of the two diffracted light beams at the time of the first impingement on the scale 90. Moiré rotations are now compensated by the combination of the scanning gratings 30, 30' and the selection and arrangement in accordance with the present invention of the ridge prisms 50, 50', because the ridge prism 50, 50' acts as a retro-reflector in the y-direction, i.e. it inverts the y-components of the beam directions of the two light beams. Following the second diffraction, or reflection at the scale 90, no y-component in the beam direction of the two homologous light beams occurs anymore, and therefore no angle difference. Different exiting directions are prevented by this, no strip system is generated and no signal drop caused by this.

Figure 3:
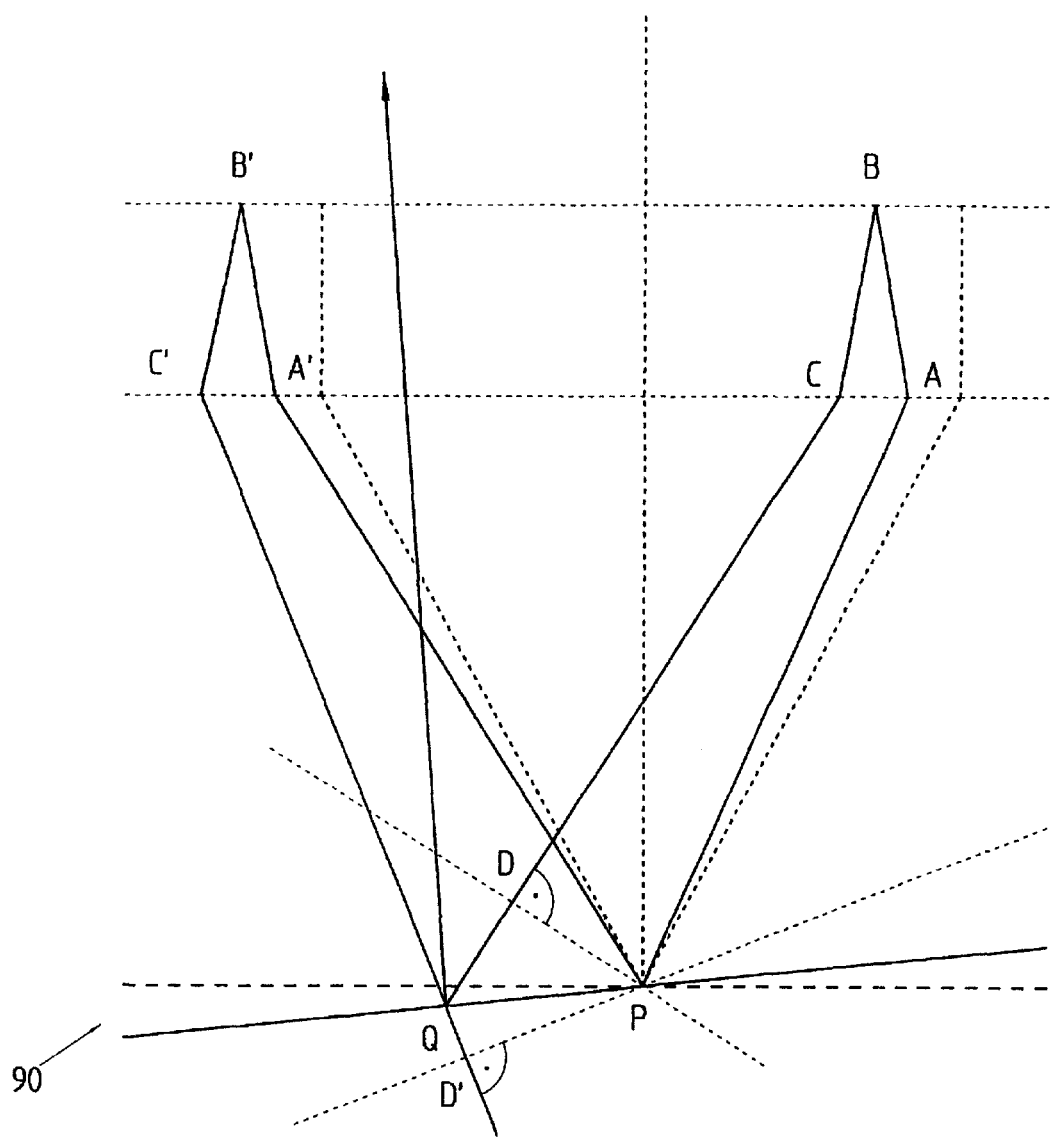
FIG. 3 schematically shows a representation to explain the changes in a beam path in case of a possible pitch tilt.

The change of the beam path in case of pitch-tilting will now be represented by FIG. 3. The vertical line with respect to the non-tilted scale 90 will be called the normal line direction in what follows. If the scale 90 is tilted in the point P by a small angle Θ in relation to the normal line direction, the diffraction angles α of the partial beams PA and PA' are changed to approximately α−2Θ, α+°with respect to the normal line direction. This means that the one light beam is propagated at a larger angle, and the other light beam at a lesser angle to the scanning grating than would be the case if the scale 90 were not tilted. The scanning grating is no longer capable of straightening the light beams. Angles of +2Θ and −2Θ result, which change corresponding to the diffraction upon entry into the ridge prism. Therefore, during their passage through the prism ABC, or A'B'C', the light beams are offset in the measuring direction by the same length AC=A'C'.

Because of the repeated diffraction at the scanning grating, the approximate angles α+2Θ and α−2Θ with respect to the normal line direction result for the beams CQ and C'Q. In this case the angles of PA and C'Q, or CQ and PA' respectively match. The two light beams are united at the point Q. As a whole, each light beam must travel a flatter and a steeper partial section. When observing this more closely it can be seen that no phase differences occur in the propagation of both light beams. The exit direction of both light beams with respect to the normal line direction in particular is identical and no interference strips are created which would be connected with a signal drop. Thus, no phase shifts of the interfering light beams because of pitch-tilting results, so that the originally measured position remains in case of pitch-tilting. Therefore the neutral point of rotation is located on the scale surface.

Figure 4:
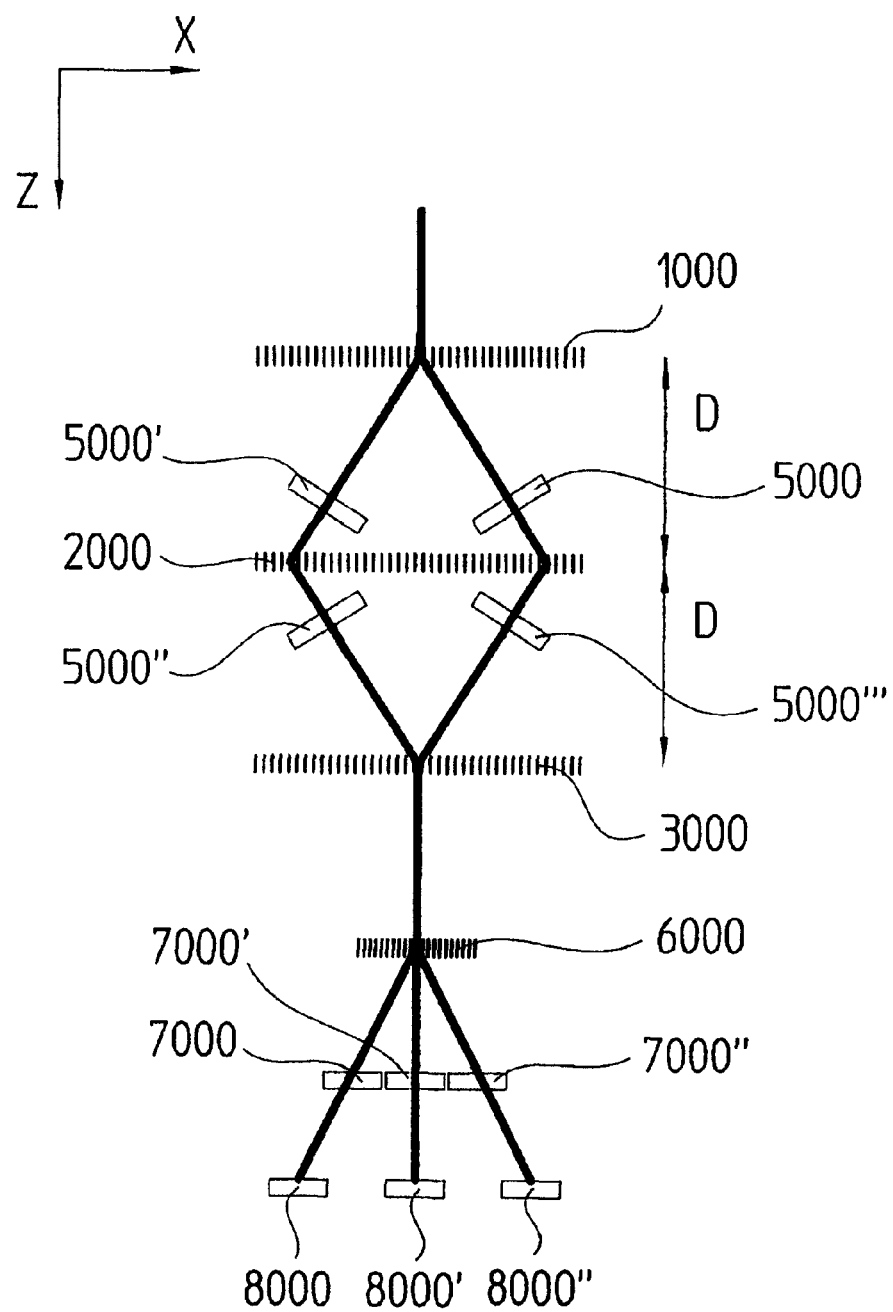
FIG. 4 schematically shows a beam path in a second embodiment of the position measuring device of the present invention in an unfolded representation.

FIG. 4 shows the beam path of a second exemplary embodiment of the position measuring device in accordance with the present invention in principle, which is now based on the scanning principle of a three-grating transmitter.

The beams initially impinging on the scale 1000 are again diffracted and thereafter traverse the small retardation plates 5000, 5000'. In contrast to the previously explained four-grating transmitter, the beams are not straightened by the scanning grating 2000, which now has half the grating period with respect to the scale grating period, but are deflected into the x-direction by Littrow diffraction. Thereafter they pass through the small retardation plates 5000, 5000' and are finally united on the scale 3000, where the two interfering light beams are aligned vertically with respect to the scale 3000 by diffraction. The subsequent processing of the interfering light beams is identical with the above explained example.

Figure 5A:
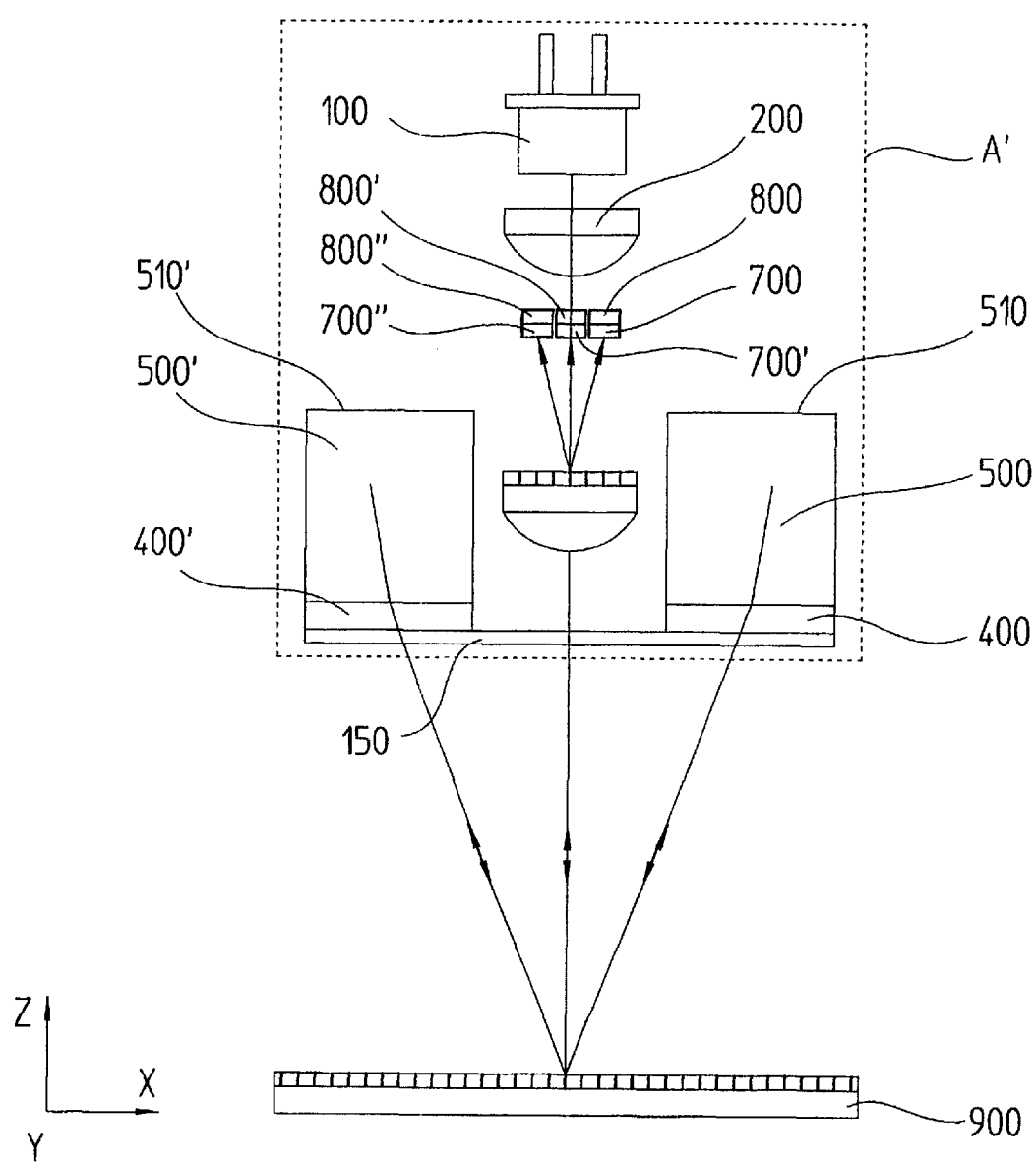
FIGS. 5a, 5b respectively show front and lateral views of the second exemplary embodiment of the position measuring device of the present invention, based on the beam path in accordance with FIG. 4.
Figure 5B:
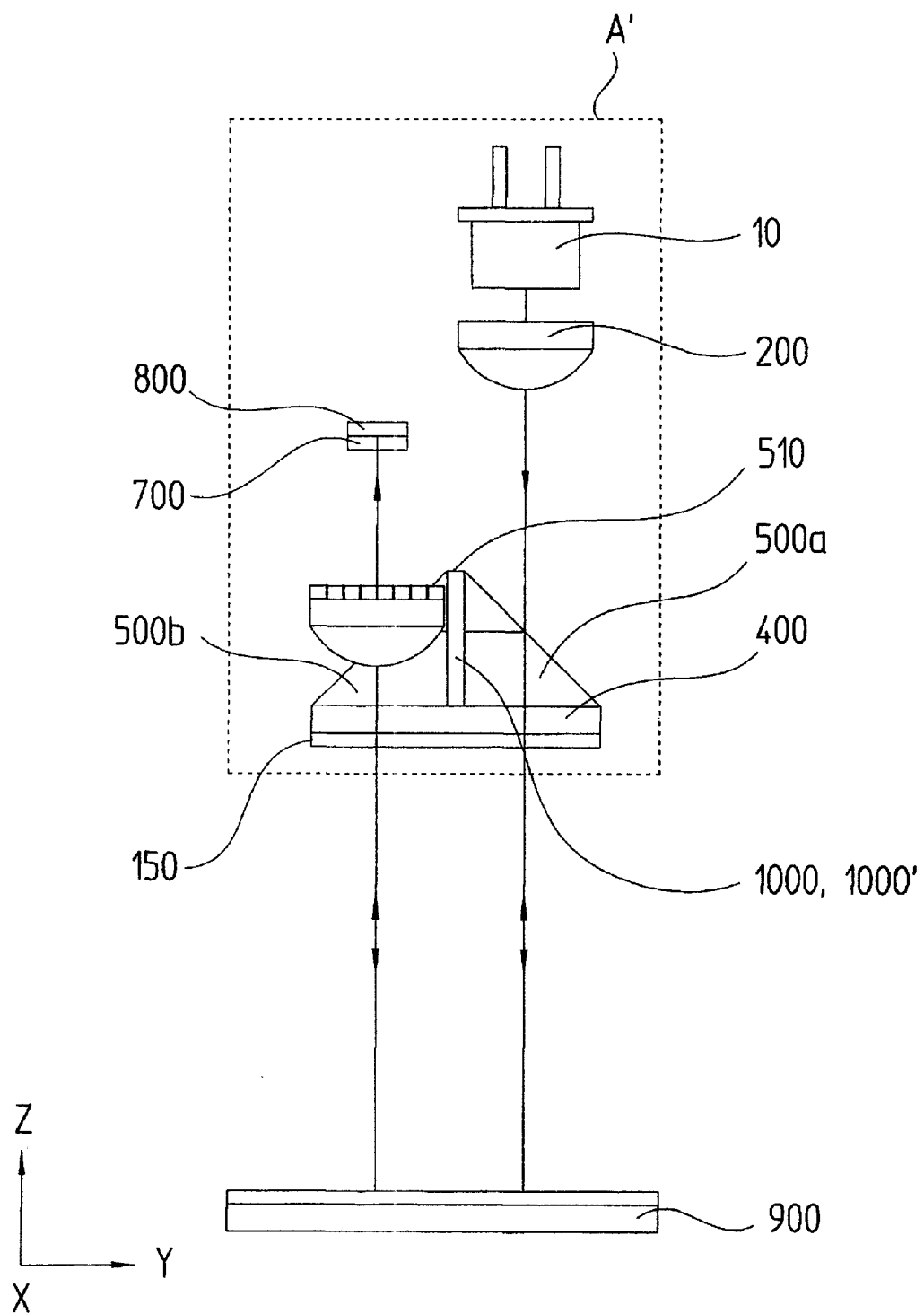

FIGS. 5a and 5b also show an actual second exemplary embodiment of the three-grating transmitter, based on the beam path in FIG. 4, in a front and lateral view.

The essential difference with the first variant lies in that the scanning gratings 1000, 1000' now are no longer on the underside of the ridge prisms 500, 500'. Instead they must be attached vertically to the underside, so that they are located between the prism tip and the underside of the prism. This can be accomplished, for example, in that two prism elements 500a, 500b are cemented to the scanning grating 1000, 1000'. It is alternatively also possible to employ ridge mirrors in place of ridge prisms. Note that the prisms 500, 500' include ridges 510, 510', respectively, as shown in FIGS. 5a–b.

The advantage of this system lies in that the directional deflection in the measuring direction can be performed with only a single scanning grating 1000, 1000', as long as the Littrow condition (grating constant of the scanning grating=half the grating constant of the scale) is maintained. Because of this, less light is lost by being diffracted into orders of diffraction which are not used than is the case with the previously described scanning system with two scanning gratings.

Otherwise the functions of the represented elements correspond to those of the previous example. Thus, a polarization-optical retardation element 400, 400' is again assigned to the scanning gratings 1000, 1000'. In principle it would be possible to again use a single ridge prism of the corresponding length in place of the arrangement of two ridge prisms 500, 500', which are spaced apart in the measuring direction x, on a common support plate 150.

Regarding the path of the scanning beams it has again been provided that the light beams emitted by the light source 100 initially impinge on a scale 900, and that from there a first reflection and diffraction in the direction of the at least one ridge prism 500, 500' takes place. A back reflection in the direction of the scale 900 takes place by means of the ridge prism 500, 500' before a second reflection of the light beams from the scale 900 in the direction of the detector element 800, 800', 800" results. Because of the different design of the ridge prism(s) 500, 500', following the first reflection at the scale 900 the light beams pass only once through the scanning grating 1000, 1000' in the ridge prism 500, 500'.

The two explained exemplary embodiments can be simply modified in the points to be explained in what follows.

Thus, it is possible to employ different light sources. Since no path differences occur, and the two interfering light beams are united at the same location, it is also possible to use chronologically and/or spatially partially coherent, or incoherent light sources. Among these are, besides mono- or multi-mode strip conductor semiconducting lasers, also VCSELs, wherein it is also possible to employ transversely multi-mode types. But even LEDs can be used.

To avoid problems with dissipation losses, the light source can be separated from the scanning unit and connected with it by an optical fiber. If the signal production is performed by an evaluation of polarization states, it is necessary to use polarization-retaining fibers.

The deflection element can furthermore be replaced by a combination of a cylinder lens and mirror. In this case the cylinder lens can also be embodied as a Fresnel cylinder lens, or as a Fresnel cylinder zone plate.

Furthermore, the ridge prisms can be replaced by ridge mirrors, i.e. by the arrangement of two mirror surfaces placed at an angle of 90° with respect to each other. The use of simple plastic prisms would alternatively also be possible.

Instead of polarizers in front of the photoelements, it is possible to use an arrangement for the signal generation, customary in interferometry, of polarizing beam splitters, with which four signals, phase-shifted by respectively 90°, are generated.

Instead of generating the measuring signal from the polarization state of the laser light, it is also possible to select the grating constants of the scale grating and the scanning grating to be slightly different. In this way an intensity strip system, which here is called a Vernier strip system, is created at the scale because of the interference of the two light beams at the scale. This is transmitted to detector elements in the form of a structured photosensor in the scanning unit, or is mapped on them. To this end the structured photosensor must have a finger structure (several rectangular photoelements of equal size, arranged laterally next to each other). The individual photoelements are wired in such a way that three signal flows, displaced by 120°, or four signal flows, displaced by 90°, are created when the Vernier strip system sweeps over the photoelements. In place of a Vernier strip system it is also possible to generate a Moiré strip system which is created when the scanning gratings are slightly turned around the normal line direction of the scale (z-direction).

Thus, besides the described examples, a number of further embodiment options exist within the framework of the present invention.

We claim:

1. A position measuring device for detecting the relative position of a scanning unit and a scale, the position measuring device comprising:
   a scale;
   a scanning unit that is displaced with respect to said scale in a measuring direction, wherein said scanning unit comprises:
     a scanning grating;
     a ridge prism comprising a ridge that is oriented parallel with said measuring direction, said ridge prism acts as a retro-reflector in a second direction which is aligned in a plane of said scale vertically with respect to said measuring direction; and
     an optoelectronic detector element.

2. The position measuring device in accordance with claim 1, wherein said scanning grating is arranged on a side of said ridge prism that is assigned to said scale.

3. The position measuring device in accordance with claim 2, further comprising a polarization-optical retardation element assigned to said scanning grating.

4. The position measuring device in accordance with claim 1, wherein said scanning unit further comprises a second ridge prism that is arranged spaced apart from said ridge prism in said measuring direction.

5. The position measuring device in accordance with claim 4, wherein said ridge prism and said second ridge prism are arranged on a common support plate.

6. The position measuring device in accordance with claim 1, further comprising a light source that emits light beams that initially impinge on said scale, from where a first reflection in a direction of said ridge prism takes place, a back reflection in a direction of said scale takes place from said ridge prism before a second reflection of light beams from said scale in a direction of said optoelectronic detector element takes place.

7. The position measuring device in accordance with claim 6, wherein following said first reflection at said scale, light beams pass a first time through said scanning grating before entering said ridge prism, by which light beams are deflected in such a way so as to be vertically oriented toward said scale, and light beams pass a second time through said scanning grating after exiting from said ridge prism.

8. The position measuring device in accordance with claim 1, wherein said scanning grating is arranged upright between a tip and an underside of said ridge prism.

9. The position measuring device in accordance with claim 8, further comprising a polarization-optical retardation element assigned to said scanning grating.

10. The position measuring device in accordance with claim 8, wherein said scanning unit further comprises a second ridge prism, which is arranged spaced apart from said ridge prism in said measuring direction.

11. The position measuring device in accordance with claim 10, wherein said ridge prism and said second ridge prism are arranged on a common support plate.

12. The position measuring device in accordance with claim 8, further comprising a light source that emits light beams that initially impinge on said scale, from where a first reflection in a direction of said ridge prism takes place, a back reflection in a direction of said scale takes place from said ridge prism before a second reflection of light beams from said scale in a direction of said optoelectronic detector element takes place.

13. The position measuring device in accordance with claim 12, wherein following said first reflection at said scale, light beams pass once through said scanning grating in said ridge prism.

14. The position measuring device in accordance with claim 8, wherein said ridge prism comprises two prism elements cemented on both sides to said scanning grating.

15. The position measuring device in accordance with claim 1, wherein said ridge prism comprises two mirror surfaces, which are arranged at a ridge angle of 90° with respect to each other.

16. The position measuring device in accordance with claim 1, further comprising:
   a second optoelectronic detector;
   a splitting grating arranged in front of said optoelectronic detector element and said second optoelectronic detector, said splitting grating splits impinging light beam into a first partial beam and a second partial beam;
   a first polarizer through which said first partial beam passes through and is detected by said optoelectronic detector; and
   a second polarizer through which said second partially beam passes through and is detected by said second optoelectronic detector, wherein said second optoelectronic detector detects a signal phase-shifted with respect to a signal detected by said optoelectronic detector.

17. The position measuring device in accordance with claim 1, further comprising a light source arranged separated from said scanning unit and said light source is connected with said scanning unit by an optical fiber.

18. The position measuring device in accordance with claim 1, wherein said scale has a grating constant that slightly differs from a grating constant of said scanning grating, and wherein said optoelectronic detector comprises a structured photosensor.

* * * * *